US009847602B1

United States Patent
Patel et al.

(10) Patent No.: US 9,847,602 B1
(45) Date of Patent: Dec. 19, 2017

(54) SHIELDED HIGH SPEED CONNECTOR WITH REDUCED CROSSTALK

(71) Applicant: DELL PRODUCTS, LP, Round Rock, TX (US)

(72) Inventors: Bhavesh Patel, Austin, TX (US); Richard D. Trotta, Pflugerville, TX (US); Bhyrav M. Mutnury, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 15/331,055

(22) Filed: Oct. 21, 2016

(51) Int. Cl.
| | |
|---|---|
| *H01R 13/66* | (2006.01) |
| *H01R 13/6461* | (2011.01) |
| *H01R 13/405* | (2006.01) |
| *H01R 13/6591* | (2011.01) |
| *G01R 29/26* | (2006.01) |

(52) U.S. Cl.
CPC ......... *H01R 13/6461* (2013.01); *G01R 29/26* (2013.01); *H01R 13/405* (2013.01); *H01R 13/6591* (2013.01)

(58) Field of Classification Search
CPC ............... H01R 13/514; H01R 13/518; H01R 13/65807; H01R 23/688; H01R 23/7073; H01R 23/005; H01R 23/725; H01R 13/658; H01R 13/6625; H01R 13/719; H01R 13/7195; H01R 13/7197
USPC ........... 439/607.07, 607.05, 607.11, 108, 65, 439/620.09
See application file for complete search history.

(56) References Cited

U.S. PATENT DOCUMENTS

| | | | | |
|---|---|---|---|---|
| 4,578,529 A | * | 3/1986 | Look | B29C 47/027 174/117 A |
| 5,911,602 A | | 6/1999 | Vaden | |
| 5,967,853 A | | 10/1999 | Hashim | |
| 6,652,318 B1 | | 11/2003 | Winings et al. | |
| 7,088,711 B2 | * | 8/2006 | Goergen | H05K 1/0228 361/788 |
| 7,186,149 B2 | * | 3/2007 | Hashim | H05K 1/0228 439/344 |
| 7,651,337 B2 | * | 1/2010 | McNamara | H01R 13/514 439/65 |
| 7,722,400 B2 | * | 5/2010 | Bixler | H01R 23/688 439/607.07 |
| 7,780,474 B2 | * | 8/2010 | Ito | H01R 23/6873 439/607.05 |
| 7,833,026 B1 | * | 11/2010 | Morgan | H01R 12/52 439/108 |

(Continued)

FOREIGN PATENT DOCUMENTS

WO    WO 2013/095335 A1    6/2013

*Primary Examiner* — Abdullah Riyami
*Assistant Examiner* — Vladimir Imas
(74) *Attorney, Agent, or Firm* — Larson Newman, LLP

(57) ABSTRACT

A connector includes a first layer having first and second communication channels, and a ground channel. The first and second communication channels form a first differential pair and transmit a differential signal. The ground channel separates the first differential pair from a next differential pair within the first layer. A surface of the ground channel nearest the first and second communication channels is selectively roughened to a particular roughness level to dampen crosstalk between the first differential pair and the next differential pair to a particular crosstalk level.

20 Claims, 3 Drawing Sheets

(56) References Cited

U.S. PATENT DOCUMENTS

| | | | |
|---|---|---|---|
| 8,016,616 B2 * | 9/2011 | Glover | H01R 12/585 439/607.05 |
| 8,232,818 B2 * | 7/2012 | Desta | G01R 1/07378 324/756.01 |
| 8,382,524 B2 * | 2/2013 | Khilchenko | H01R 12/724 439/620.09 |
| 8,734,185 B2 * | 5/2014 | Gailus | H01R 13/6608 439/620.21 |
| 8,764,464 B2 | 7/2014 | Buck et al. | |
| 8,961,228 B2 * | 2/2015 | Jeon | H01R 13/6463 439/607.07 |

\* cited by examiner

SHIELDED HIGH SPEED CONNECTOR WITH REDUCED CROSSTALK

FIELD OF THE DISCLOSURE

This disclosure generally relates to information handling systems, and more particularly relates to a shielded high speed connector with reduced crosstalk.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A connector includes a first layer having first and second communication channels, and a ground channel. The first and second communication channels form a first differential pair and transmit a differential signal. The ground channel separates the first differential pair from a next differential pair within the first layer. A surface of the ground channel nearest the first and second communication channels is selectively roughened to a particular roughness level to dampen crosstalk between the first differential pair and the next differential pair to a particular crosstalk level.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
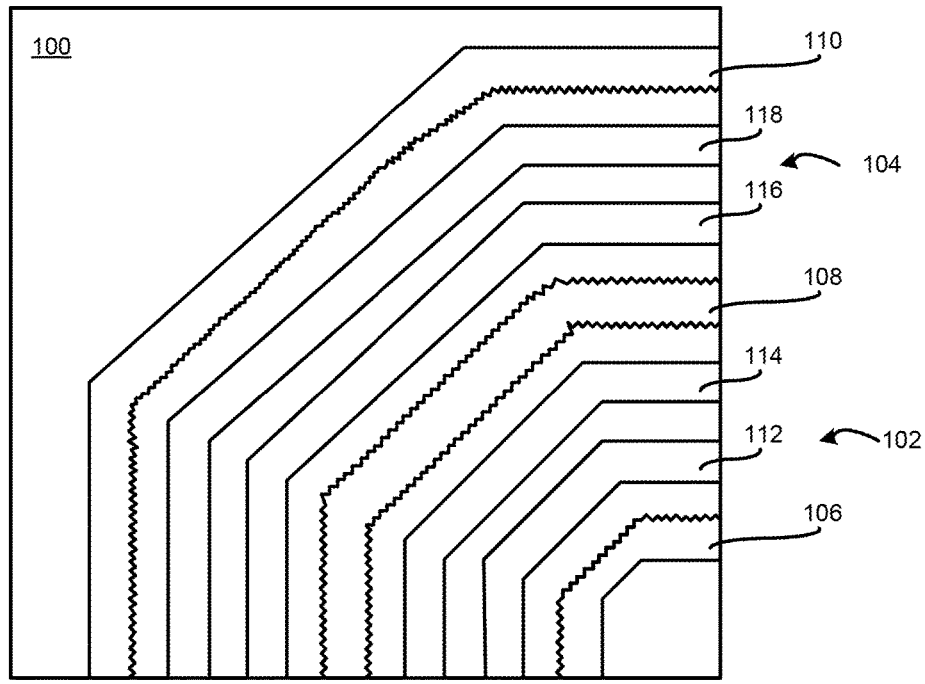
FIG. 1 is schematic side view of a connector according to an embodiment of the present disclosure.

FIG. 1 illustrates an embodiment of a connector 100 of an information handling system. For the purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The connector 100 includes differential pairs 102 and 104, and ground channels 106, 108, and 110. The differential pair 102 includes communication channels 112 and 114, and differential pair 104 includes communication channels 116 and 118. The communication channels 112 and 114 are surrounded by the ground channels 106 and 108. Similarly, the communication channels 116 and 118 are surrounded by the ground channels 108 and 110.

The connector 100 can be utilizes communication channels 112, 114, 116, and 118 to enable communication between two printed circuit boards (PCBs). In an embodiment, the communication channels 112 and 114 of differential pair 102 can combine to provide a differential signal from one PCB to the next PCB, and the communication channels 116 and 118 of differential pair 104 can combine to provide another differential signal from one PCB to the next PCB. The ground channels 106, 108, and 110 provide a return path for signals on the differential pairs 102 and 104. In an embodiment, the connector 100 can include more or less communication channels and/or ground channels without differing from the disclosure herein. The ground channel 108 separates the differential pairs 102 and 104 within the layer of the connector 100. In an embodiment, the ground channels 106, 108, and 110, and the communication channels 112, 114, 116, and 118 can all be located in the same layer of the connector 100. In an embodiment, the connector 100 can be an insert molded lead-frame assembly (IMLA) connector.

In an embodiment, the PCBs connected together by connector 100 can support technologies that transmit signals at high speeds. For example, signals can be transmitted in a range of 25-56 Gbps, at 64 Gbps, or the like. However, as the speed of transmission increases, the crosstalk between signals transmitted on the differential pairs 102 and 104 can also increase. The crosstalk can be a near field problem in the connector 100, and can be classified as common mode impedance coupling, electromagnetic field coupling, or the like. The common mode impedance coupling can result from the signals transmitted on the differential pairs 102 and 104 sharing a common return path, such as ground channel 108. The electromagnetic field coupling can happen across the differential pairs. If the ground channels 106, 108, and 110 are smooth copper on all surfaces of the ground channels, the crosstalk between signals on the differential pairs 102 and 104 can include resonances at different frequencies as shown by waveform 302 of FIG. 3 below.

Figure 2:
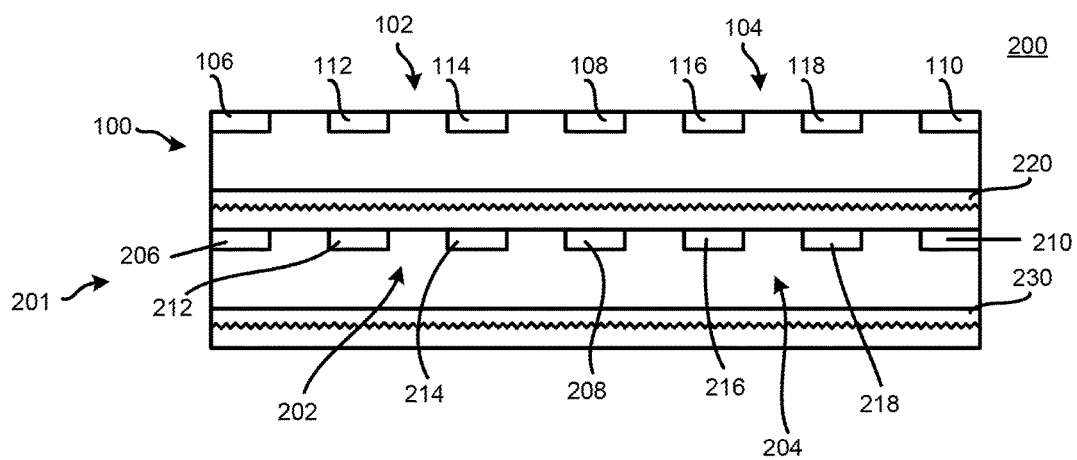
FIG. 2 is schematic cross-sectional view of the connector according to an embodiment of the present disclosure.

FIG. 2 illustrates a connector layer 200 including connector layers 100 and 201 according to an embodiment of the present disclosure. In an embodiment, the connector layer 100 can be substantially similar to the connector 100 described above with respect to FIG. 1. In particular, connector layer 100 includes differential pairs 102 and 104, and ground channels 106, 108, and 110. The communication channels 112 and 114 combine to create differential pair 102, and the communication channels 116 and 118 combine to create differential pair 104. In an embodiment, the communication channels 112, 114, 116, and 118 can transmit signals from one PCB to the next in a similar fashion as described above with respect to FIG. 1. The ground channels 106, 108, and 110 can provide a return path for the signals. The connector layer 100 also includes a ground shield 220 at the bottom of the connector layer.

The connector layer 201 includes differential pairs 202 and 204, ground channels 206, 208, and 210, and a ground shield 230. The differential pair 202 includes communication channels 212 and 214, and differential pair 204 includes communication channels 216 and 218. The communication channels 212 and 214 are surrounded by the ground channels 206 and 208. Similarly, the communication channels 216 and 218 are surrounded by the ground channels 208 and 210.

The connector layer 200 can be utilizes communication channels 212, 214, 216, and 218 to enable communication between two PCBs. In an embodiment, the communication channels 212 and 214 of differential pair 202 can combine to provide a differential signal from one PCB to the next PCB, and the communication channels 216 and 218 of differential pair 204 can combine to provide another differential signal from one PCB to the next PCB. The ground channels 206, 208, and 210 provide a return path for signals on the differential pairs 202 and 204. The ground channel 208 separates the differential pairs 202 and 204 within the layer of the connector layer 200.

The crosstalk between signals transmitted on the differential pairs 202 and 204 in connector layer 201 also include crosstalk resonances as described above for differential pairs 102 and 104. In an embodiment, crosstalk can also occur in connector 200 between signals on a differential pair in the connector layer 100 and signals on a differential pair in the connector layer 201. For example, crosstalk can result between a signal transmitted on differential pair 102 and a signal transmitted on differential pair 202. Similarly, crosstalk can result between a signal transmitted on differential pair 104 and a signal transmitted on differential pair 204. If the ground shields 220 and 230 are smooth copper on all surfaces of the ground shield, the crosstalk between signals on the differential pairs 102 and 202 and the crosstalk between signals on the differential pairs 104 and 204 can include resonances at different frequencies as shown by waveform 302 of FIG. 3 below.

Figure 3:
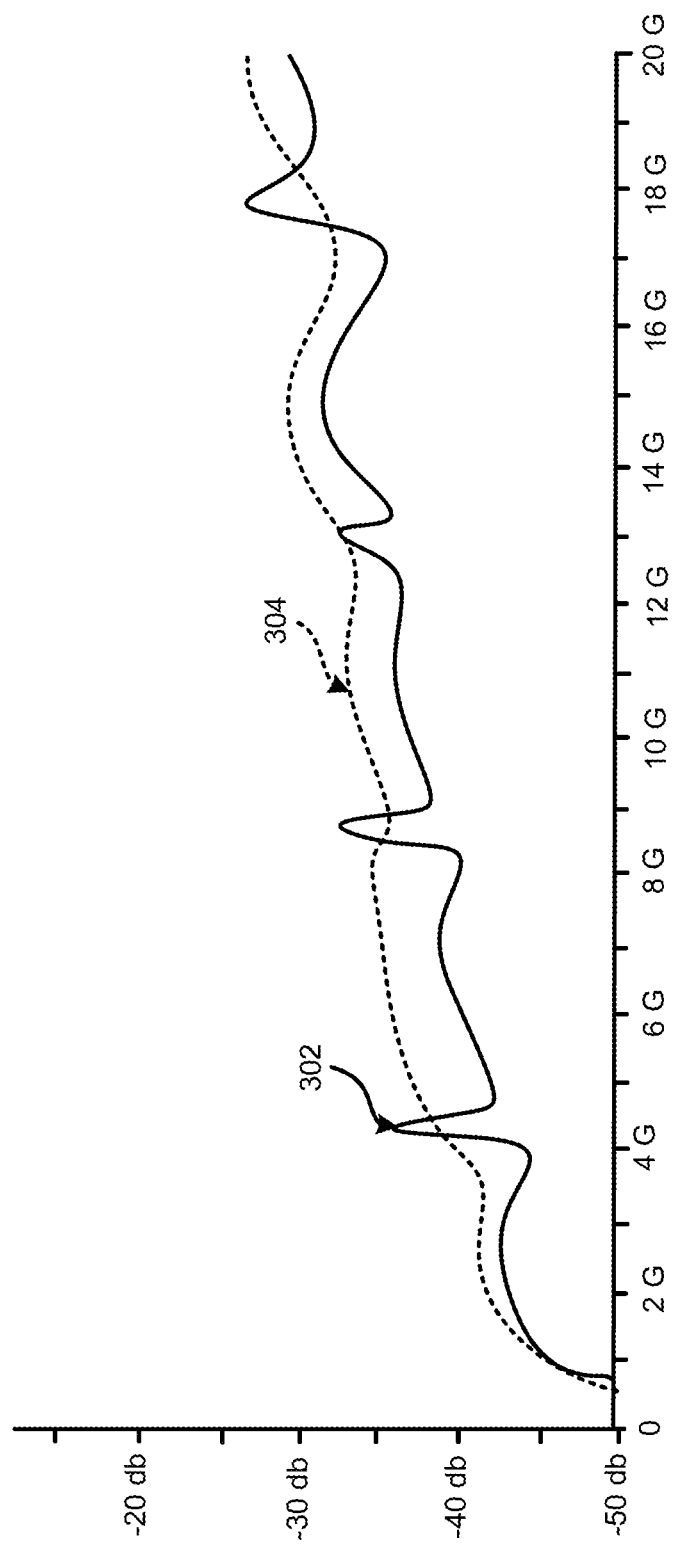
FIG. 3 illustrates waveforms associated with the connector of FIG. 1 according to an embodiment of the present disclosure.

FIG. 3 illustrates waveforms 302 and 304 associated with the connector 100 of FIG. 1 according to an embodiment of the present disclosure. In an embodiment, waveform 302 represents crosstalk between signals on differential pairs 102 and 104 of the connector 100 if the ground channels 106, 108, and 110 are smooth with resonances in the crosstalk. For example, waveform 302 shows high crosstalk at resonant frequencies of around 4.5 GHz, 9 GHz, 13.5 GHz, and 18 GHz. In another embodiment, waveform 302 represents crosstalk between signals on differential pairs 102 and 202 or signals on differential pairs 104 and 204 if the ground shied 220 is smooth.

Referring back to FIG. 1, the ground channels 106, 108, and 110 can be selectively roughened to reduce or dampen the crosstalk between the signals on the differential pairs 102 and 104. In an embodiment, the amount of crosstalk between signals on the differential pairs 102 and 104 can be determined by modeling communication in the connector 100. Upon the amount of crosstalk being determined, one or more of the ground channels 106, 108, and 110 can be roughened to dampen the crosstalk between the differential pairs 102 and 104. In an embodiment, the roughening can be in a range from 25 μm to 250 μm depending on the desired dampening. For example, the higher the amount of crosstalk and the resonances in the crosstalk, the higher the amount of roughening on the ground channels 106, 108, and 110.

In an embodiment, only the surfaces of the ground channels 106, 108, and 10 nearest to or facing a communication channel can be roughened. For example, only one surface of ground channel 106 is roughened, such as the surface nearest to and facing communication channel 112. Similarly, only one surface of ground channel 110 is roughened, such as the surface nearest to and facing communication channel 118. However, two surfaces of ground channel 108 is roughened, such as the surface nearest to and facing communication channel 112, and the surface nearest to and facing communication channel 118. The roughening of the ground channels 106, 108, and 110 can dampen the crosstalk between signals on the differential pairs 102 and 104 as compared to smooth ground channels without impacting signal loss. In an embodiment, the roughening of the ground channels 106, 108, and 110 can reduce the crosstalk at resonant frequencies between the differential pairs 102 and 104, as shown by waveform 304 of FIG. 3.

Referring back to FIG. 2, the ground shields 220 and 230 can be selectively roughened to reduce or dampen the crosstalk between the signals on the differential pairs 102 and 202, and to dampen the crosstalk between the signals on the differential pairs 104 and 204. In an embodiment, the amount of crosstalk between signals on the differential pairs 102 and 202 and between differential pairs 104 and 204 can be determined by modeling communication in the connector 100. Upon the amount of crosstalk being determined, one or both of the ground shields 220 and 230 can be roughened to dampen the crosstalk between the differential pairs 102 and 104. In an embodiment, the roughening can be in a range from 25 µm to 250 µm depending on the desired dampening.

In an embodiment, only the surfaces of the ground shields 220 and 230 nearest to and facing a communication channel can be roughened. For example, only one surface of ground shield 220 is roughened, such as the surface nearest to and facing communication channels 212, 214, 216, and 218. In an embodiment, the ground shield 230 may be roughened if there is crosstalk between signals on the differential pairs 202 and 204 and signals on differential pairs in another connector layer. The roughening of the ground shield 220 can dampen the crosstalk between signals on the differential pairs 102 and 202 and signals on differential pairs 104 and 204 as compared to smooth ground shields without impacting signal loss. In an embodiment, the roughening of the ground shield 220 can reduce the crosstalk at resonant frequencies between the differential pairs 102 and 202, and can reduce the crosstalk at resonant frequencies between the differential pairs 104 and 204, as shown by waveform 304 of FIG. 3. In different embodiments, any combination of roughening of the ground channels 106, 108, and 110 and the ground shields 220 and 230 can be selectively utilized based on the different amounts of crosstalk level determined in the modeling of transmitting signals through the connector 200.

Referring back to FIG. 3, waveform 304 represents crosstalk between signals on the differential pairs 102 and 104 of connector 100 with the ground channels 106, 108, and 110 roughened. For example, waveform 304 shows that the roughened ground channels 106, 108, and 110 can cause a dampening of the crosstalk at the resonant frequencies, as compared to a smooth ground channels 106, 108, and 110 as illustrated by waveform 302, at resonant frequencies of around 4.5 GHz, 9 GHz, 13.5 GHz, and 18 GHz. In an embodiment, waveform 304 can represent crosstalk between signals on the differential pairs 102 and 202 of connector 200 with the ground shield 220 roughened. In another embodiment, waveform 304 can represent crosstalk between signals on the differential pairs 104 and 204 of connector 200 with the ground shield 220 roughened.

Thus, roughening of the ground channels 106, 108, and 110, and/or the ground shields 220 and 230 can reduced crosstalk and improve the eye plot of the signals transmitted on the differential pairs 102, 104, 202, and 204. The roughening of the ground channels 106, 108, and 110, and/or the ground shields 220 and 230 therefore reduce crosstalk without resulting in signal loss based on the communication channels 112, 114, 116, 118, 212, 214, 216, and 218 not being changed.

Figure 4:
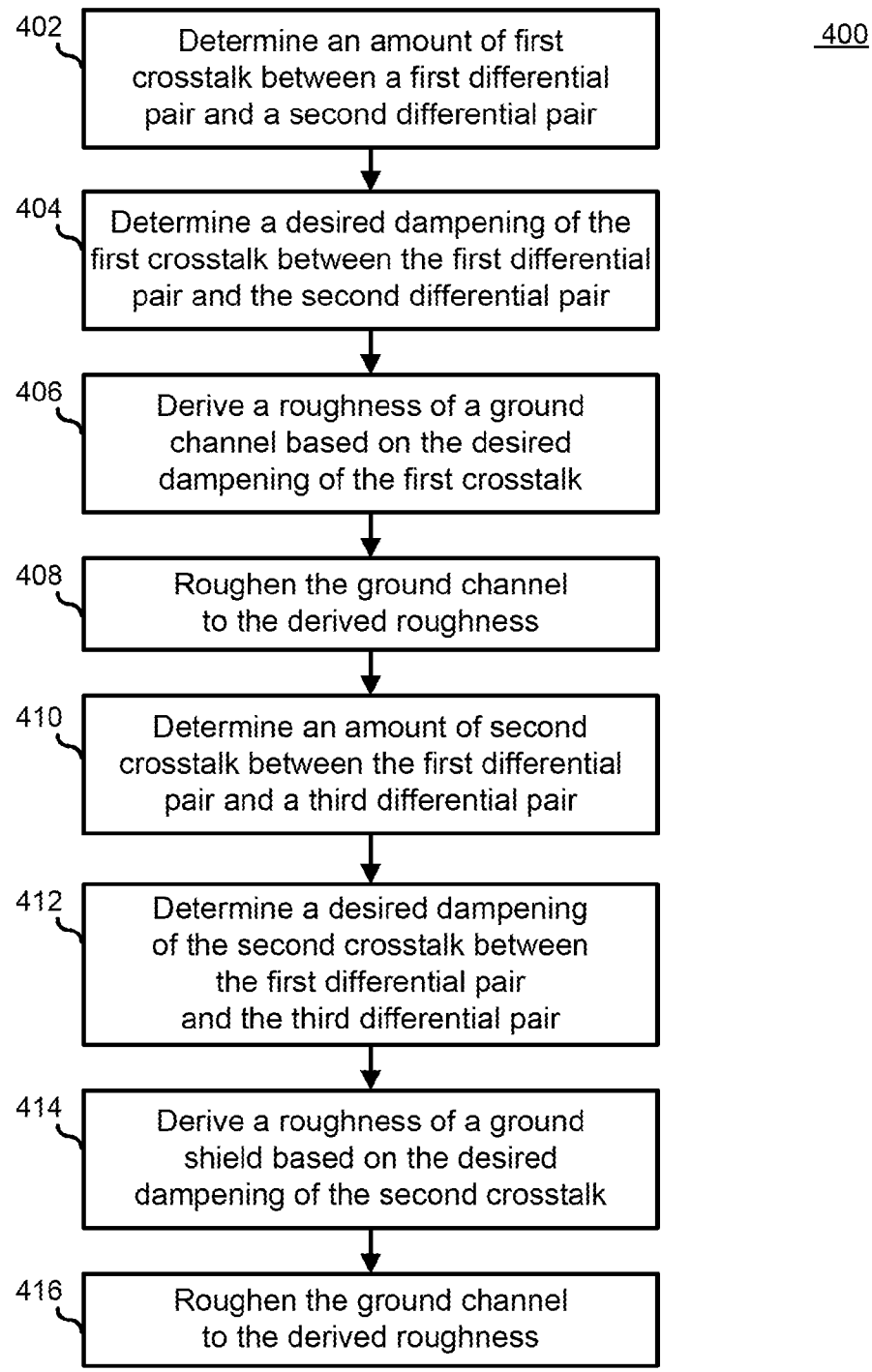
FIG. 4 illustrates a flow chart of a method for creating the connector with roughened ground channels and ground shields according to an embodiment of the present disclosure.

FIG. 4 illustrates a method 400 for creating connector with roughened ground channels and ground shields according to an embodiment of the present disclosure. At block 402, an amount of crosstalk is determined between signals on a first differential pair and a second differential pair. In an embodiment, the first differential pair and the second differential pair can be located on the same layer of an IMLA connector. A desired dampening of the crosstalk between the first differential pair and the second differential pair can be determined at block 404. At block 406, a roughness of a ground channel is derived or calculated based on the desired dampening of the crosstalk. In an embodiment, the roughening can be in a range from 25 µm to 250 µm depending on the desired dampening. For example, the higher the dampening the higher the amount of roughening on the ground channel. The ground channel is roughened to the derived roughness at block 408. In an embodiment, only a surface of the ground channel facing the differential pair is roughened.

At block 410, an amount of crosstalk is determined between signals on the first differential pair and a third differential pair. In an embodiment, the first differential pair and the third differential pair can be located on the different layers of an IMLA connector. A desired dampening of the crosstalk between the first differential pair and the third differential pair can be determined at block 412. At block 414, a roughness of a ground shield is derived based on the desired dampening of the crosstalk. In an embodiment, the roughening can be in a range from 25 µm to 250 µm depending on the desired dampening. The ground shield is roughened to the derived roughness at block 416. In an embodiment, only a surface of the ground shield nearest to the communication channels of the differential pairs is roughened.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A connector comprising:
   a first layer including:
      first and second communication channels to transmit a differential signal, wherein the first and second communication channels form a first differential pair; and
      a ground channel to separate the first differential pair from a next differential pair within the first layer, a surface of the ground channel nearest the first and second communication channels is selectively roughened to a particular roughness level to dampen crosstalk between the first differential pair and the next differential pair to a particular crosstalk level.

2. The connector of claim 1, further comprising:
   a second layer including:
      third and fourth communication channels to transmit another differential signal, wherein the third and fourth communication channels form a second differential pair; and
   a shield layer located in between the first layer and the second layer, a surface of the shield layer nearest to the second layer is selectively roughened to the particular roughness level to dampen crosstalk between the first differential pair and the second differential pair to the particular crosstalk level.

3. The connector of claim 1, wherein a surface of the second ground channel nearest the first and second communication channels is selectively roughened to the particular roughness level to dampen crosstalk between the first differential pair and the next differential pair to a particular crosstalk level.

4. The connector of claim 1, wherein the specific amount of roughness is within a range of roughness from 25 µm to 250 µm.

5. The connector of claim 1, the particular roughness level is selected based on modeling data for the connector.

6. The connector of claim 1, wherein the first layer is an insert molded lead-frame assembly (IMLA).

7. The connector of claim 1, wherein the particular roughness level is selected based on both an increase in an overall signal loss level, and on the dampening of the crosstalk.

8. A connector comprising:
   a first layer including:
      first and second communication channels to transmit a differential signal, wherein the first and second communication channels form a first differential pair;
      third and fourth communication channels to transmit a differential signal, wherein the third and fourth communication channels form a second differential pair; and
   a ground channel disposed between the second communication channel and the third communication channel within the first layer, a first surface of the ground channel nearest the second communication channel and a second surface of the ground channel nearest the third communication channel are selectively roughened to a particular roughness level to dampen crosstalk between the first differential pair and the second differential pair to a particular crosstalk level.

9. The connector of claim 8, further comprising:
   a second layer including:
      fifth and sixth communication channels to transmit a differential signal, wherein the fifth and sixth communication channels form a third differential pair; and
   a ground shield located in between the first layer and the second layer, a surface of the shield layer nearest to the second layer is selectively roughened to the particular roughness level to dampen crosstalk between the first differential pair and the third differential pair to the particular crosstalk level.

10. The connector of claim 8, wherein the specific amount of roughness is within a range of roughness from 25 µm to 250 µm.

11. The connector of claim 8, the particular roughness level is selected based on modeling data for the connector.

12. The connector of claim 8, wherein the first layer is an insert molded lead-frame assembly (IMLA).

13. The connector of claim 8, wherein the particular roughness level is selected based on both an increase in an overall signal loss level, and on the dampening of the crosstalk.

14. A method comprising:
   determining an amount of first crosstalk between signals on a first differential pair and a second differential pair;
   determining a first desired dampening of the first crosstalk;
   deriving a first specific amount of roughness for a ground channel based on the first desired dampening of the first crosstalk; and
   roughening the ground channel to the first specific amount of roughness.

15. The method of claim 14, further comprising:
   determining an amount of second crosstalk between signals on the first differential pair and a third differential pair;
   determining a second desired dampening of the second crosstalk;
   deriving a second specific amount of roughness for a ground shield based on the second desired dampening of the second crosstalk; and
   roughening the ground shield to the second specific amount of roughness.

16. The method of claim 15, wherein the first differential pair and the third differential pair can be located on different layers of an insert molded lead-frame assembly (IMLA) connector.

17. The method of claim 15, wherein only a surface of the ground shield nearest the third differential pair is roughened.

18. The method of claim 14, wherein the first differential pair and the second differential pair are located on the same layer of an insert molded lead-frame assembly (IMLA) connector.

19. The method of claim 14, wherein the derived roughness is within a range of roughness from 25 µm to 250 µm.

20. The method of claim 14, wherein only a surface of the ground channel facing the differential pair is roughened.

* * * * *